US012660556B2

(12) United States Patent　　　(10) Patent No.:　US 12,660,556 B2

Li et al.　　　(45) Date of Patent:　Jun. 16, 2026

(54) USING UN-PATTERNED AND PATTERNED METROLOGY TARGETS FOR IN SITU PROCESS MONITORING

(71) Applicant: Applied Materials, Inc., Santa Clara, CA (US)

(72) Inventors: Shifang Li, Pleasanton, CA (US); Yudong Hao, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 286 days.

(21) Appl. No.: 18/396,226

(22) Filed: Dec. 26, 2023

(65) Prior Publication Data

US 2025/0210385 A1　　Jun. 26, 2025

(51) Int. Cl.
*H10P 72/00* (2026.01)
*G01B 11/06* (2006.01)
*G01N 21/31* (2006.01)

(52) U.S. Cl.
CPC ...... *H10P 72/0604* (2026.01); *G01B 11/0616* (2013.01); *G01N 21/31* (2013.01)

(58) Field of Classification Search
CPC .. H10P 72/0604; G01B 11/0616; G01N 21/31
See application file for complete search history.

(56) References Cited

U.S. PATENT DOCUMENTS

| | | | |
|---|---|---|---|
| 5,347,460 A | 9/1994 | Gifford et al. | |
| 6,812,077 B1 * | 11/2004 | Chan ................ | H01L 21/28123 |
| | | | 438/188 |

| | | | |
|---|---|---|---|
| 2002/0154302 A1 | 10/2002 | Rosencwaig et al. | |
| 2004/0246476 A1 * | 12/2004 | Bevis ................ | G01N 21/9501 |
| | | | 356/237.5 |
| 2005/0032250 A1 | 2/2005 | Mui et al. | |
| 2007/0020890 A1 | 1/2007 | Thakur et al. | |
| 2008/0059141 A1 * | 3/2008 | Finarov ................ | G03F 1/84 |
| | | | 703/13 |

(Continued)

FOREIGN PATENT DOCUMENTS

| | | |
|---|---|---|
| KR | 20070058374 A | 6/2007 |
| TW | 202111310 A | 3/2021 |

OTHER PUBLICATIONS

U.S. Appl. No. 18/203,353, Non-Final Office Action, Mailed On Sep. 24, 2025, 16 pages.

(Continued)

*Primary Examiner* — Michelle M Iacoletti
*Assistant Examiner* — Mohamed Doumbia
(74) *Attorney, Agent, or Firm* — Kilpatrick Townsend & Stockton LLP

(57) ABSTRACT

A system and method for providing analysis of at least some of a plurality of un-patterned and patterned metrology targets during a fabrication process. A sample is arranged within a chamber of a semiconductor processing tool. The sample has the plurality of un-patterned and patterned metrology targets. A metrology tool integrated with the semiconductor processing tool can provide the analysis of at least some of the plurality of un-patterned and patterned metrology targets. One or more parameters associated with the plurality of patterned metrology targets are determined using optical metrology signals from the plurality of un-patterned metrology targets.

19 Claims, 9 Drawing Sheets

(56)　　　　　　References Cited

U.S. PATENT DOCUMENTS

| 2009/0059240 | A1* | 3/2009 | Hartig ................ G01B 11/0625 |
| | | | 356/636 |
| 2012/0203369 | A1 | 8/2012 | Behm et al. |
| 2013/0039460 | A1 | 2/2013 | Levy et al. |
| 2018/0059019 | A1 | 3/2018 | Chouaib et al. |
| 2018/0108578 | A1 | 4/2018 | Pandev et al. |
| 2020/0073255 | A1* | 3/2020 | Montilla ............. G03F 7/70608 |
| 2020/0124978 | A1 | 4/2020 | Chen |
| 2021/0005436 | A1* | 1/2021 | Vaez-Iravani ........... C23C 14/54 |

OTHER PUBLICATIONS

Office Action for Application No. TW113119024, Mailed On Sep. 10, 2025, 13 pages.

U.S. Appl. No. 18/203,353 , Final Office Action, Mailed On Apr. 16, 2026, 18 pages.

* cited by examiner

600

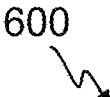

Design un-patterned multi-layer metrology targets that have the same film stacks and the same thickness values as nearby patterned multi-layer metrology targets.     605

Add the un-patterned and patterned multi-layer metrology targets to semiconductor sample     610

Process the semiconductor sample in a manner that the un-patterned and patterned multi-layer metrology targets receive the same processing in the same chambers.     615

Collect optical metrology signals on the un-patterned and patterned multi-layer metrology targets simultaneously.     620

Use the optical metrology signals from the un-patterned multi-layer metrology targets to assist with analysis of the patterned multi-layer metrology targets.     625

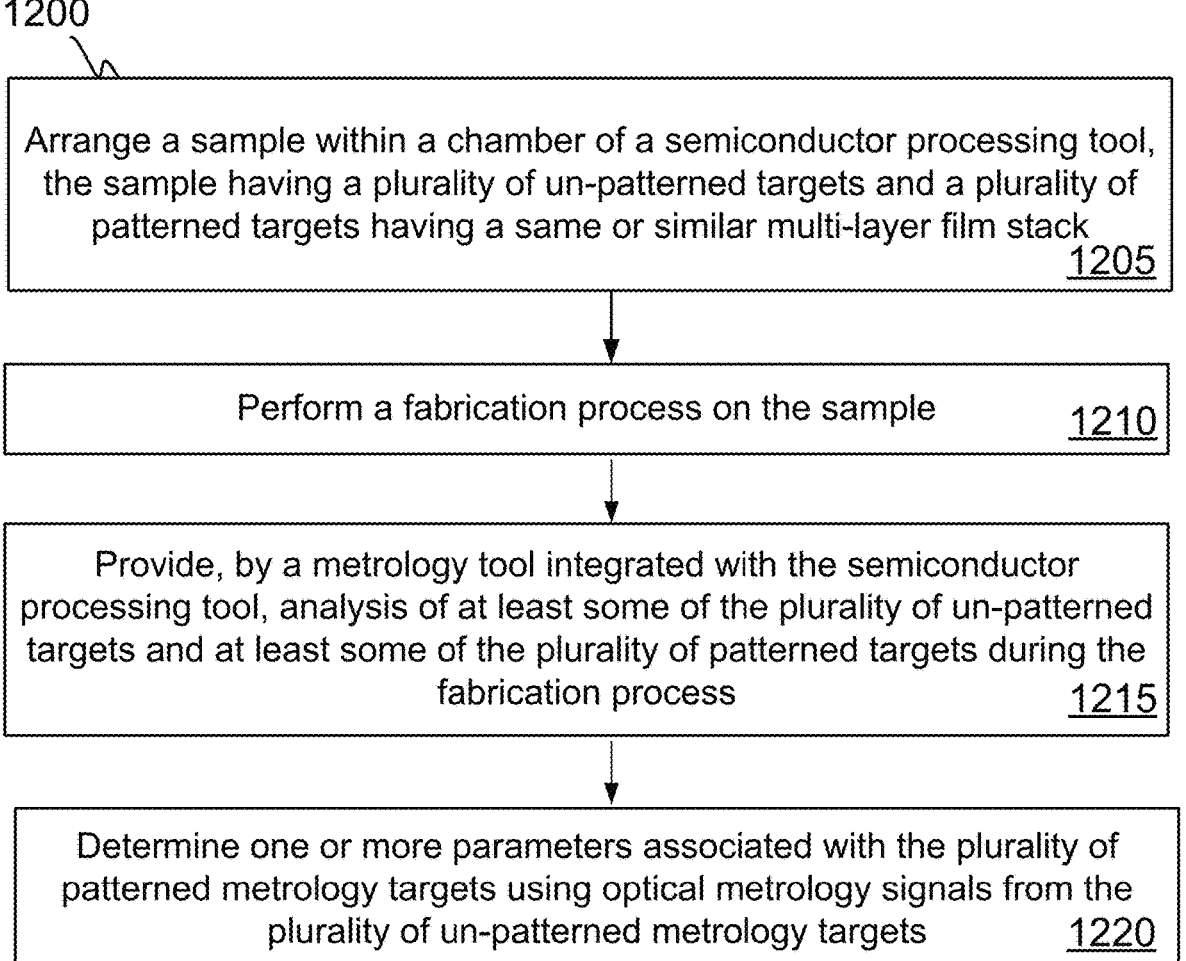

Arrange a sample within a chamber of a semiconductor processing tool, the sample having a plurality of un-patterned targets and a plurality of patterned targets having a same or similar multi-layer film stack
1205

Perform a fabrication process on the sample          1210

Provide, by a metrology tool integrated with the semiconductor processing tool, analysis of at least some of the plurality of un-patterned targets and at least some of the plurality of patterned targets during the fabrication process          1215

Determine one or more parameters associated with the plurality of patterned metrology targets using optical metrology signals from the plurality of un-patterned metrology targets          1220

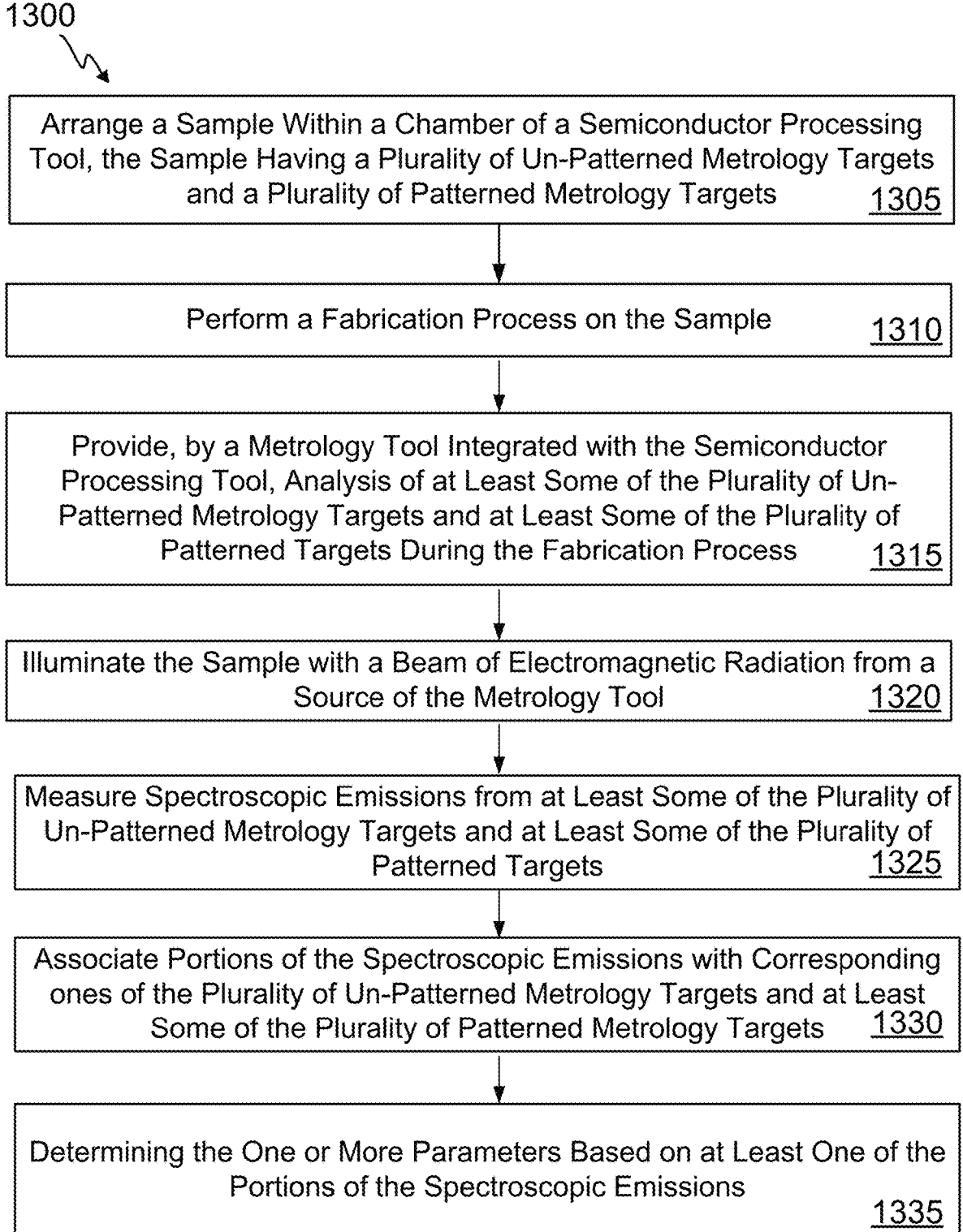

Arrange a Sample Within a Chamber of a Semiconductor Processing Tool, the Sample Having a Plurality of Un-Patterned Metrology Targets and a Plurality of Patterned Metrology Targets          1305

Perform a Fabrication Process on the Sample          1310

Provide, by a Metrology Tool Integrated with the Semiconductor Processing Tool, Analysis of at Least Some of the Plurality of Un-Patterned Metrology Targets and at Least Some of the Plurality of Patterned Targets During the Fabrication Process          1315

Illuminate the Sample with a Beam of Electromagnetic Radiation from a Source of the Metrology Tool          1320

Measure Spectroscopic Emissions from at Least Some of the Plurality of Un-Patterned Metrology Targets and at Least Some of the Plurality of Patterned Targets          1325

Associate Portions of the Spectroscopic Emissions with Corresponding ones of the Plurality of Un-Patterned Metrology Targets and at Least Some of the Plurality of Patterned Metrology Targets          1330

Determining the One or More Parameters Based on at Least One of the Portions of the Spectroscopic Emissions          1335

FIG. 8

USING UN-PATTERNED AND PATTERNED METROLOGY TARGETS FOR IN SITU PROCESS MONITORING

TECHNICAL FIELD

The present disclosure relates generally to semiconductor fabrication, and more particularly (although not necessarily exclusively), to using un-patterned and patterned metrology targets on a sample to determine one or more parameters associated with the patterned metrology targets.

BACKGROUND

Recent advances in performance optimization of semiconductor materials have driven the need to combine multiple process steps into a single vacuum mainframe (e.g. deposit, etch, implant and anneal without breaking vacuum) or into a single chamber. This in-vacuum, in-chamber integration of different process steps onto a single vacuum mainframe or chamber avoids variable, deleterious effects of atmospheric contamination on very thin and chemically active films and interfaces.

Emerging deployment of in-vacuum and in-chamber process integration also creates new challenges for semiconductor device metrology. Measurements which are typically performed at atmosphere in dedicated, standalone metrology tools must now be performed in situ or in the vacuum mainframe of a process tool where space constraints limit options to enhance measurement sensitivity through movement of the metrology optics or the device under test.

SUMMARY

Some embodiments propose systems and methods to extract enhanced optical and process control information from interrogation of un-patterned and patterned metrology targets using imaging reflectometry techniques. Certain aspects and examples of the present disclosure relate to using samples having un-patterned and patterned metrology targets to enable simultaneous analysis of the different targets during a fabrication process. Spectroscopic emissions from the different targets can provide different signals to enhance sensitivity to the fabrication process. In accordance with a particular embodiment, for example, a system includes a semiconductor processing tool: a sample arranged within a chamber of the semiconductor processing tool, the sample having a plurality of un-patterned metrology targets and a plurality of patterned metrology targets, the plurality of un-patterned metrology targets and the plurality of patterned metrology targets both having or sharing a same multi-layer film stack; and a metrology tool integrated with the semiconductor processing tool, wherein the metrology tool is configured to provide analysis of at least some of the plurality of un-patterned metrology targets and at least some of the plurality of patterned metrology targets during the fabrication process, and wherein optical metrology signals from the un-patterned metrology targets are used to determine one or more parameters associated with the patterned metrology targets.

In an embodiment, the metrology tool is configured to provide in situ analysis of at least some of the plurality of un-patterned metrology targets and at least some of the plurality of patterned metrology targets simultaneously.

In another embodiment, the metrology tool comprises a source configured to provide a beam of electromagnetic radiation: an optical system configured to direct the beam of electromagnetic radiation from the source to the sample, wherein the un-patterned metrology targets and the patterned metrology targets on the sample provide spectroscopic emissions when illuminated with the beam of electromagnetic radiation: a detector configured to measure the spectroscopic emissions from the un-patterned metrology targets and the patterned metrology targets: one or more processors; and a memory that includes instructions executable by the one or more processors for causing the one or more processors to: associate portions of the spectroscopic emissions with corresponding ones of the plurality of un-patterned metrology targets and the plurality of patterned metrology targets; and determine the one or more parameters associated with the patterned metrology targets. Some embodiments also include instructions executable by the one or more processors for causing the one or more processors to derive at least one result regarding the fabrication process based on the one or more parameters associated with the patterned targets, wherein the at least one result comprises a change in width, depth, or sidewall angle associated with features on the patterned metrology targets. The instructions executable by the one or more processors may cause the one or more processors to adjust at least one process parameter of the fabrication process based at least in part on the at least one result.

In another embodiment, determining the one or more parameters associated with the patterned metrology targets includes determining thicknesses of one or more layers of the multi-layer film stack on at least one of the plurality of un-patterned metrology targets, and using the thicknesses of the one or more layers to determine the one or more parameters associated with the plurality of patterned metrology targets.

In another embodiment, determining the one or more parameters associated with the patterned metrology targets includes simultaneously or iteratively fitting a film thickness model associated with the multi-layer film stack on the un-patterned metrology targets and fitting a critical dimension model associated with the one or more parameters.

In another embodiment, at least one of the plurality of un-patterned metrology targets are proximate to at least some of the plurality of patterned metrology targets on the sample.

In another embodiment, the metrology tool is configured to perform multi-spectral imaging techniques or multi-channel imaging techniques.

In yet another embodiment, the plurality of patterned metrology targets include structures forming lines and spaces therebetween.

In some embodiments, the metrology tool may comprise an imaging device configured to simultaneously or periodically obtain spectroscopic images of at least some of the plurality of un-patterned metrology targets and at least some of the plurality of patterned metrology targets during the fabrication process: one or more processors; and a memory that includes instructions executable by the one or more processors for causing the one or more processors to: associate portions of the spectroscopic images with corresponding ones of the plurality of un-patterned metrology targets and the plurality of patterned metrology targets; and determine the one or more parameters associated with the patterned metrology targets. The one or more parameters may comprise a width, depth, sidewall angle, or pitch associated with at least one of the lines and/or spaces.

Some embodiments may include instructions executable by the one or more processors for causing the one or more processors to train a machine-learning model to identify a critical dimension of the structures in a future fabrication process using the one or more parameters.

Some embodiments may include instructions executable by the one or more processors for causing the one or more processors to adjust at least one process parameter of the fabrication process based at least in part on the one or more parameters. The at least one process parameter may comprise pressure, flow, or a radio frequency of an electromagnetic field used during the fabrication process.

The un-patterned metrology targets may be designed to assist in analysis of the patterned metrology targets.

In accordance with another embodiment, a method includes arranging a sample within a chamber of a semiconductor processing tool, the sample having a plurality of un-patterned metrology targets and a plurality of patterned metrology targets, the plurality of un-patterned metrology targets and the plurality of patterned metrology targets both having a same multi-layer film stack: performing a fabrication process on the sample: providing, by a metrology tool integrated with the semiconductor processing tool, analysis of at least some of the plurality of un-patterned metrology targets and at least some of the plurality of patterned metrology targets during the fabrication process; and determining one or more parameters associated with the patterned metrology targets using optical metrology signals from the un-patterned metrology targets.

In an embodiment, providing the analysis of at least some of the plurality of un-patterned metrology targets and at least some of the plurality of patterned metrology targets includes: illuminating the sample with a beam of electromagnetic radiation from a source of the metrology tool: measuring spectroscopic emissions from at least some of the plurality of un-patterned metrology targets and at least some of the plurality of patterned metrology targets: associating portions of the spectroscopic emissions with corresponding ones of the plurality of un-patterned metrology targets and the plurality of patterned metrology targets; and determining the one or more parameters based on at least one of the portions of the spectroscopic emissions.

In another embodiment, determining the one or more parameters associated with the patterned metrology targets includes determining thicknesses of one or more layers of the multi-layer film stack on at least one of the plurality of un-patterned metrology targets, and using the thicknesses of the one or more layers to determine the one or more parameters associated with the patterned metrology targets.

In yet another embodiment, determining the one or more parameters associated with the patterned targets includes simultaneously or iteratively fitting a film thickness model associated with the multi-layer film stack on the un-patterned metrology targets and fitting a critical dimension model associated with the one or more parameters.

A further understanding of the nature and advantages of the present invention may be realized by reference to the following portions of the specification and attached drawings.

BRIEF DESCRIPTION OF THE DRAWINGS

FIG. 4 is a flowchart outlining an exemplary method for providing analysis of at least some of a plurality of metrology targets on a sample in accordance with an embodiment.

FIGS. 7-8 are flowcharts outlining exemplary methods for providing analysis of at least some of a plurality of un-patterned metrology targets and at least some of a plurality of patterned metrology targets in accordance with some embodiments.

DETAILED DESCRIPTION

Certain aspects and examples of the present disclosure relate to using samples having un-patterned and patterned metrology targets to enable parameter analysis during a fabrication process. The samples can be placed in a semiconductor processing tool and exposed to the fabrication process. A metrology tool integrated with the semiconductor processing tool can provide analysis of at least some of the un-patterned and patterned metrology targets during the fabrication process. At least one parameter associated with the plurality of patterned metrology targets can be derived based on the analysis.

Using the un-patterned and patterned metrology targets can enable in situ and simultaneous analysis providing improved fabrication process control. Similar on-tool conclusions may not be derived from fabrication environments that do not include the samples with the plurality of un-patterned and patterned metrology targets. For example, a fabrication environment that includes a sample with a single patterned metrology target may not have sufficient content to derive the on-tool conclusions about fabrication process performance. As another example, multiple un-patterned and/or patterned metrology targets that only enable ex-situ analysis may fail to derive the on-tool conclusions due to a lack of immediate, in situ data that reveals an evolution of a geometry of the metrology targets and hence the device features driven by the fabrication process over time.

Figure 1:
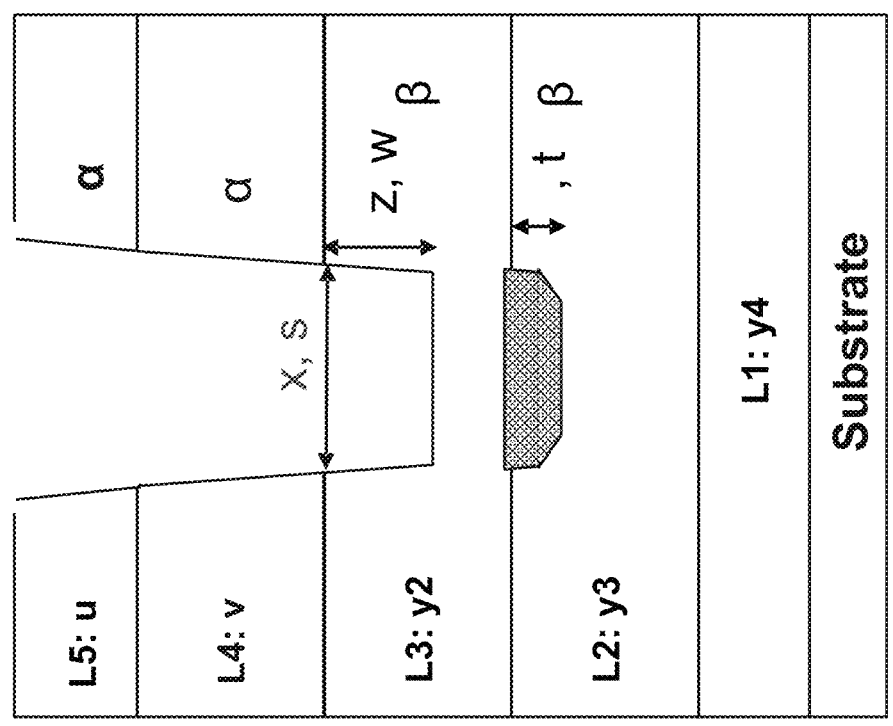
FIG. 1 is a simplified cross-sectional view of a patterned metrology target.

In some examples, the plurality of patterned metrology targets can include line and space structures. FIG. 1 is a simplified cross-sectional view of a patterned metrology target that may be representative of a line and space structure. When only a patterned metrology target is used for analysis, whether in situ or in vacuum, the metrology signals are often insufficient to decouple variables in the film stack. The exemplary film stack in FIG. 1 includes five layers (L1-L5) and a space S having sloped sidewalls that extends into the third layer (L3). Direct measurement results of such structures are often unstable or inaccurate due to cross-talk between the multiple variables.

Figure 2:
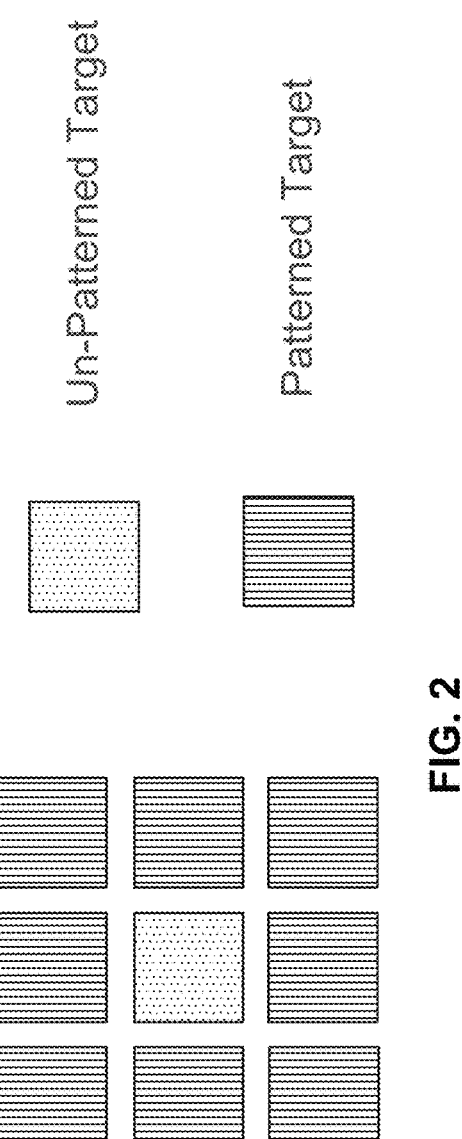
FIGS. 2-3 are simplified plan and cross-sectional views of un-patterned and patterned metrology targets in accordance with an embodiment.
Figure 3:
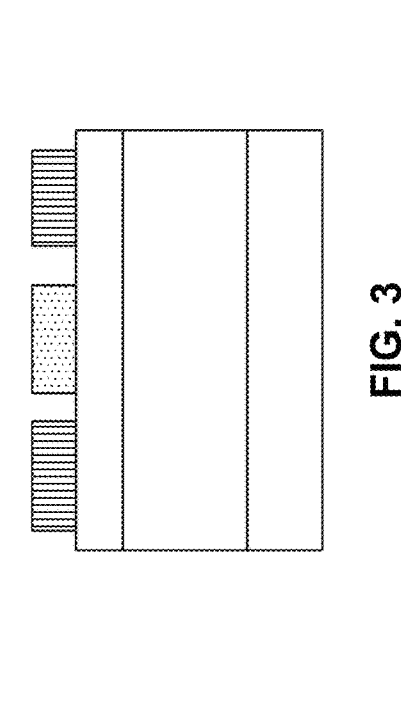

FIGS. 2-3 are simplified plan and cross-sectional views of un-patterned and patterned metrology targets in accordance with an embodiment. The un-patterned and patterned metrology targets may be dedicated structures formed on scribe lines between die, they may be structures formed within the die, or they may be areas of the die that can be used for metrology measurements. In the example shown in these figures, a single un-patterned metrology target is surrounded on each side by patterned metrology targets as shown in the plan view of FIG. 2. This is merely an example however and is not intended to be limiting. Configurations may include additional un-patterned metrology targets and more or fewer patterned metrology targets having other shapes and/or configurations. Also, the patterned metrology targets may have similar or different patterned structures. The cross-sectional view in FIG. 3 shows that the un-patterned and patterned metrology targets share the same underlying film stack layers. In some embodiments, the underlying film stack layers may be at least partially etched between the metrology targets rather than extend continuously between the metrology targets as shown in the example of FIG. 3.

FIG. 4 is a flowchart outlining an exemplary method 600 for providing analysis of at least some of a plurality of metrology targets on a sample in accordance with an embodiment. At block 605, the method 600 involves designing un-patterned multi-layer metrology targets that have the same film stacks with the same thickness values as nearby patterned multi-layer metrology targets. In some examples, at least some of the un-patterned multi-layer metrology targets and at least some of the nearby or proximate patterned multi-layer metrology targets are designed so that they are within a single field of view of a metrology tool so that they can be imaged simultaneously or within a single line scan of the metrology tool so that they can be imaged sequentially.

At block 610, the method 600 involves adding the un-patterned and patterned multi-layer metrology targets to a semiconductor sample. The un-patterned and patterned multi-layer metrology targets may be dedicated structures formed on scribe lines between die, they may be structures formed within the die, or they may be areas of the die that can be used for metrology measurements.

At block 615, the method 600 involves processing the semiconductor sample in a semiconductor processing tool so that the un-patterned and patterned multi-layer metrology targets receive the same processing in the same chambers of the semiconductor processing tool. The processing may include any semiconductor processing step including, for example, deposition, etch, implant, anneal, etc.

At block 620, the method 600 involves collecting optical metrology signals on the un-patterned and patterned multi-layer metrology targets simultaneously using a metrology tool integrated with the semiconductor processing tool. In some embodiments, the semiconductor sample may be analyzed in situ during a processing step so that an evolution of geometries on the un-patterned and patterned multi-layer metrology targets can be monitored.

At block 625, the method 600 involves using the optical metrology signals from the un-patterned multi-layer metrology targets to assist with analysis of the patterned multi-layer metrology targets. In an embodiment, the optical metrology signals from the un-patterned multi-layer metrology targets are used to determine a thickness of films in a film stack on the un-patterned multi-layer metrology target, and the results are used in the measurement of critical dimensions (CD's) on the patterned multi-layer metrology targets.

It should be appreciated that the specific steps illustrated in FIG. 4 provide a particular method for analyzing of at least some of a plurality of metrology targets on a sample in accordance with an embodiment. Other sequences of steps may also be performed according to alternative embodiments. For example, alternative embodiments may perform the steps outlined above in a different order. Moreover, the individual steps illustrated in FIG. 4 may include multiple sub-steps that may be performed in various sequences. Furthermore, additional steps may be added or removed depending on the particular application.

Figure 5:
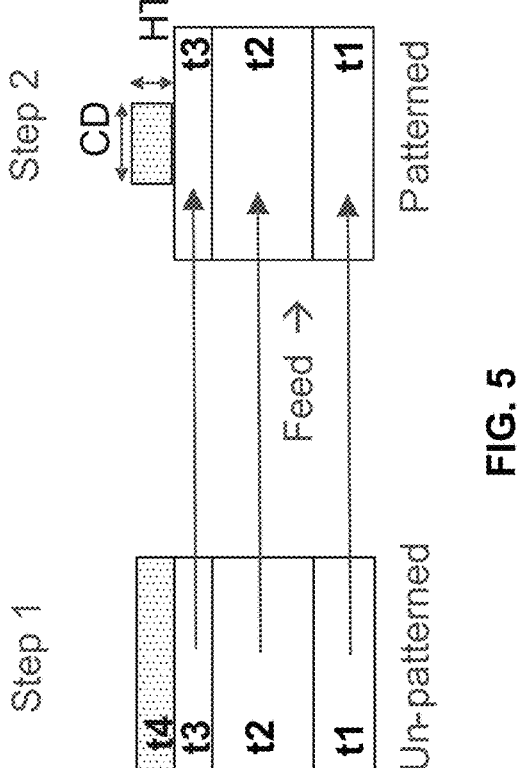
FIG. 5 illustrates a feed forward analysis technique in accordance with an embodiment.

Optical metrology signals from un-patterned metrology targets may be used in a number of ways to assist with analysis of patterned metrology targets. For example, FIG. 5 illustrates a feed forward analysis technique in accordance with an embodiment. In this example, thicknesses t1-t3 are measured on un-patterned metrology target(s) and fed forward for use in determining CD width and CD thickness (i.e., HT) on patterned metrology target(s). The process may involve obtaining optical metrology signals from the un-patterned metrology target(s) and using the optical metrology signals from the un-patterned metrology target(s) to fit a film model to determine the thicknesses t1-t3. Optical metrology signals from the patterned metrology target(s) are also obtained, and the optical metrology signals from the patterned metrology target(s) are used to fit a CD model where the thicknesses t1-t3 are fixed and the CD and HT float. The thicknesses t1-t3 are fixed at the values measured on the un-patterned metrology target(s). This simplifies the CD measurements.

Figure 6:
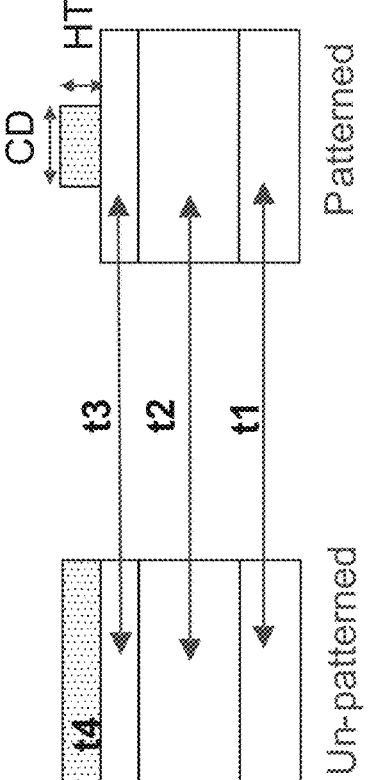
FIG. 6 illustrates a multi-model co-optimization analysis technique in accordance with an embodiment.

FIG. 6 provides another example where optical metrology signals from un-patterned metrology targets are used to assist with analysis of patterned metrology targets. In this example, the optical metrology signals from un-patterned metrology target(s) and patterned metrology target(s) are used in a known multi-model co-optimization analysis technique. Using this technique, the optical metrology signals from the un-patterned metrology target(s) and the patterned metrology target(s) are combined and used to fit the film thickness and CD models. Using the co-optimization analysis technique reduces the total degrees of freedom to the union of both models.

FIG. 7 is a flowchart outlining an exemplary method 1200 for providing analysis of at least some of a plurality of un-patterned metrology targets and at least some of a plurality of patterned metrology targets in accordance with an embodiment. At block 1205, the method 1200 involves arranging a sample within a chamber of a semiconductor processing tool, the sample having a plurality of metrology un-patterned targets and a plurality of patterned metrology targets having a same or similar multi-layer film stack. The multi-layer film stack includes the layers underlying the un-patterned and patterned metrology targets. In an embodiment, the patterned metrology targets include line and space structures. The patterned metrology targets may have the same or different pattern structures. For example, the structures on the patterned metrology targets may have different geometries, pitch, line to space ratio, and/or orientations.

At block 1210, the method 1200 involves performing a fabrication process on the sample. The fabrication process may include, for example, an etch or deposition process.

At block 1215, the method 1200 involves providing, by a metrology tool integrated with the semiconductor processing tool, analysis of at least some of the plurality of un-patterned metrology targets and at least some of the plurality of patterned metrology targets during the fabrication process. The process tool may utilize, for example, multi-spectral reflectometry for the analysis. In an embodiment, the analysis may be performed on the un-patterned metrology targets and the patterned metrology targets simultaneously.

At block 1220, the method 1200 involves determining one or more parameters associated with the patterned metrology targets using optical metrology signals from the un-patterned metrology targets. The one or more parameters may include, for example, CD's of the structures on the patterned metrology targets.

FIG. 8 is a flowchart outlining an exemplary method 1300 for providing analysis of at least some of a plurality of un-patterned metrology targets and at least some of a plurality of patterned metrology targets in accordance with another embodiment. At block 1305, the method 1300 involves arranging a sample within a chamber of a semiconductor processing tool, the sample having a plurality of un-patterned metrology targets and a plurality of patterned metrology targets. The sample has the same film stacks underlying the plurality of un-patterned metrology targets and the plurality of patterned metrology targets. In an embodiment, the patterned metrology targets include line and space structures. The patterned metrology targets may have the same or different pattern structures. For example, the structures may have different geometries, pitch, line to space ratio, and/or orientations.

At block 1310, the method involves performing a fabrication process on the sample. The fabrication process may include, for example, an etch or deposition process.

At block 1315, the method involves providing, by a metrology tool integrated with the semiconductor processing tool, analysis of at least some of the plurality of un-patterned metrology targets and at least some of the plurality of patterned metrology targets during the fabrication process. The metrology tool may be an imaging reflectometer. The imaging reflectometer may have a field of view that can encompass multiple metrology targets, and/or the imaging reflectometer may be configured to perform a line scan to measure multiple metrology targets.

At block 1320, the method involves illuminating the sample with a beam of electromagnetic radiation from a source of the metrology tool. The metrology tool may use multi-spectral or multi-channel illumination techniques.

At block 1325, the method involves measuring spectroscopic emissions from at least some of the plurality of un-patterned metrology targets and at least some of the plurality of patterned metrology targets. The spectroscopic emissions may be reflected portions of the beam of electromagnetic radiation. In an embodiment, the spectroscopic emissions from the un-patterned metrology targets and the patterned metrology targets may be measured simultaneously.

At block 1330, the method involves associating portions of the spectroscopic emissions with corresponding ones of the plurality of un-patterned metrology targets and the plurality of patterned metrology targets. For example, the un-patterned metrology targets and the patterned metrology targets may provide different spectroscopic emissions, and the patterned metrology targets having different patterns and/or structures may provide different spectroscopic emissions. An origin of the spectroscopic emissions on the surface of the sample can be consistent with coordinates on the surface associated with one of the un-patterned metrology targets or the patterned metrology targets. The coordinates can help locate the metrology targets on the surface of the sample and associate the spectroscopic emissions with the appropriate metrology target.

At block 1335, the method involves determining one or more parameters based on at least one of the portions of the spectroscopic emissions. For example, CD's on the patterned metrology targets may be determined based on spectroscopic emissions from the un-patterned metrology targets.

It should be appreciated that the specific steps illustrated in FIGS. 7-8 provide particular methods for analyzing of at least some of a plurality of metrology targets on a sample in accordance with some embodiments. Other sequences of steps may also be performed according to alternative embodiments. For example, alternative embodiments may perform the steps outlined above in a different order. Moreover, the individual steps illustrated in FIGS. 7-8 may include multiple sub-steps that may be performed in various sequences. Furthermore, additional steps may be added or removed depending on the particular application.

Figure 9:
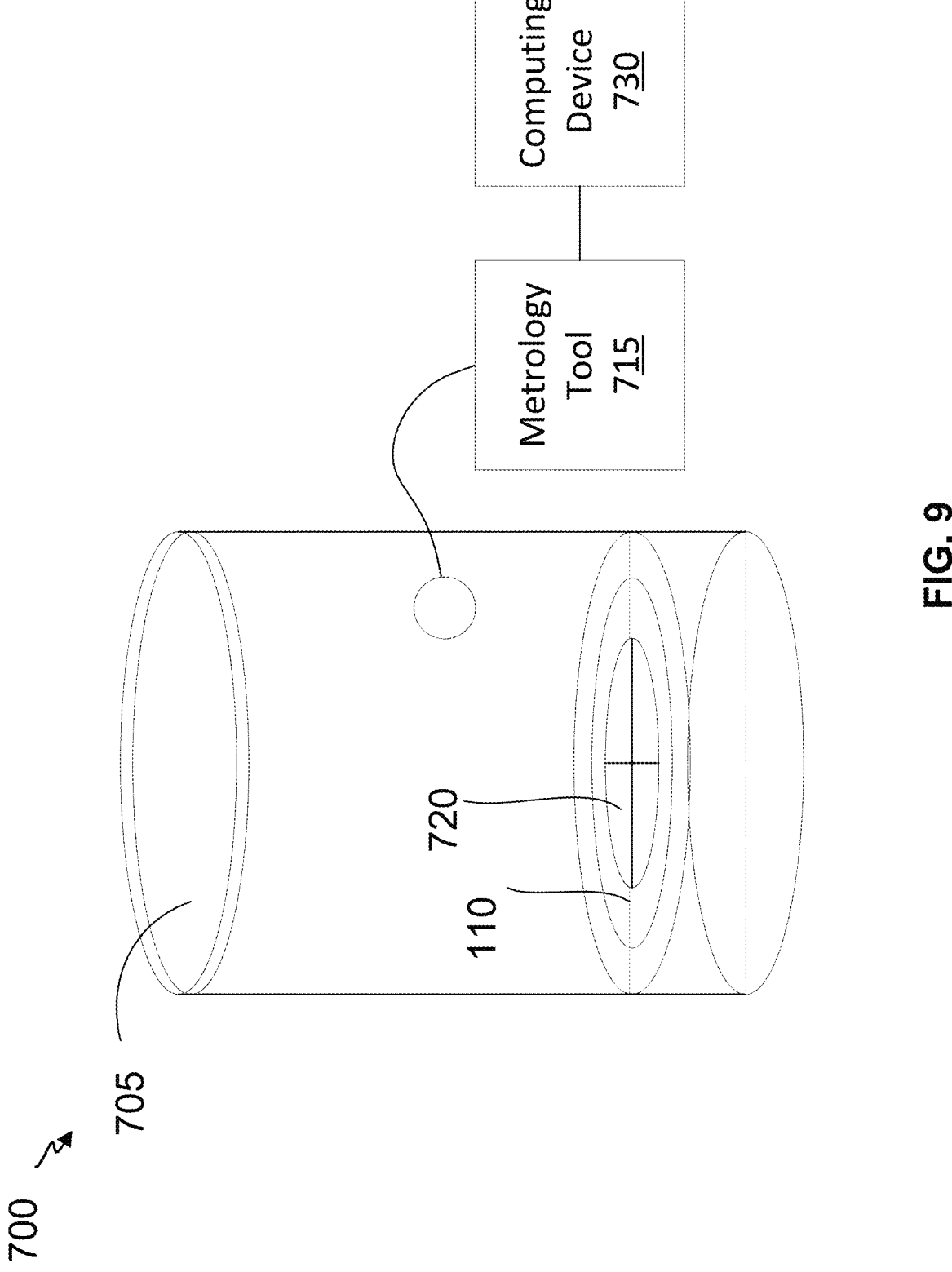
FIG. 9 is a schematic of an environment for providing in situ analysis of a sample having a plurality of metrology targets according to an embodiment.

FIG. 9 is a schematic of an environment 700 for providing in situ analysis of a sample having a plurality of metrology targets according to one example of the present disclosure. The environment 700 can include a semiconductor processing tool having a chamber 705, a metrology tool 715, and a computing device 730. The semiconductor processing chamber 705 can include a sample stage 710 configured to support a sample 720 having a plurality of metrology targets.

The sample 720 can be arranged on the sample stage 710 of the semiconductor processing chamber 705 where the fabrication process can be performed on the sample 720. The metrology tool 715 can be integrated with the semiconductor processing chamber 705 and communicatively coupled to the computing device 730. In some examples, the computing device 730 is integrated with the metrology tool 715. The metrology tool 715 can provide analysis of at least some of the plurality of targets of the sample 720 during the fabrication process. In some embodiments, analysis of un-patterned metrology targets and patterned metrology targets may be performed simultaneously.

It should be appreciated that the environment 700 is used merely as an example, and other types and/or configurations of semiconductor processing tools and/or processing chambers may be used with the embodiments described herein.

Figure 10:
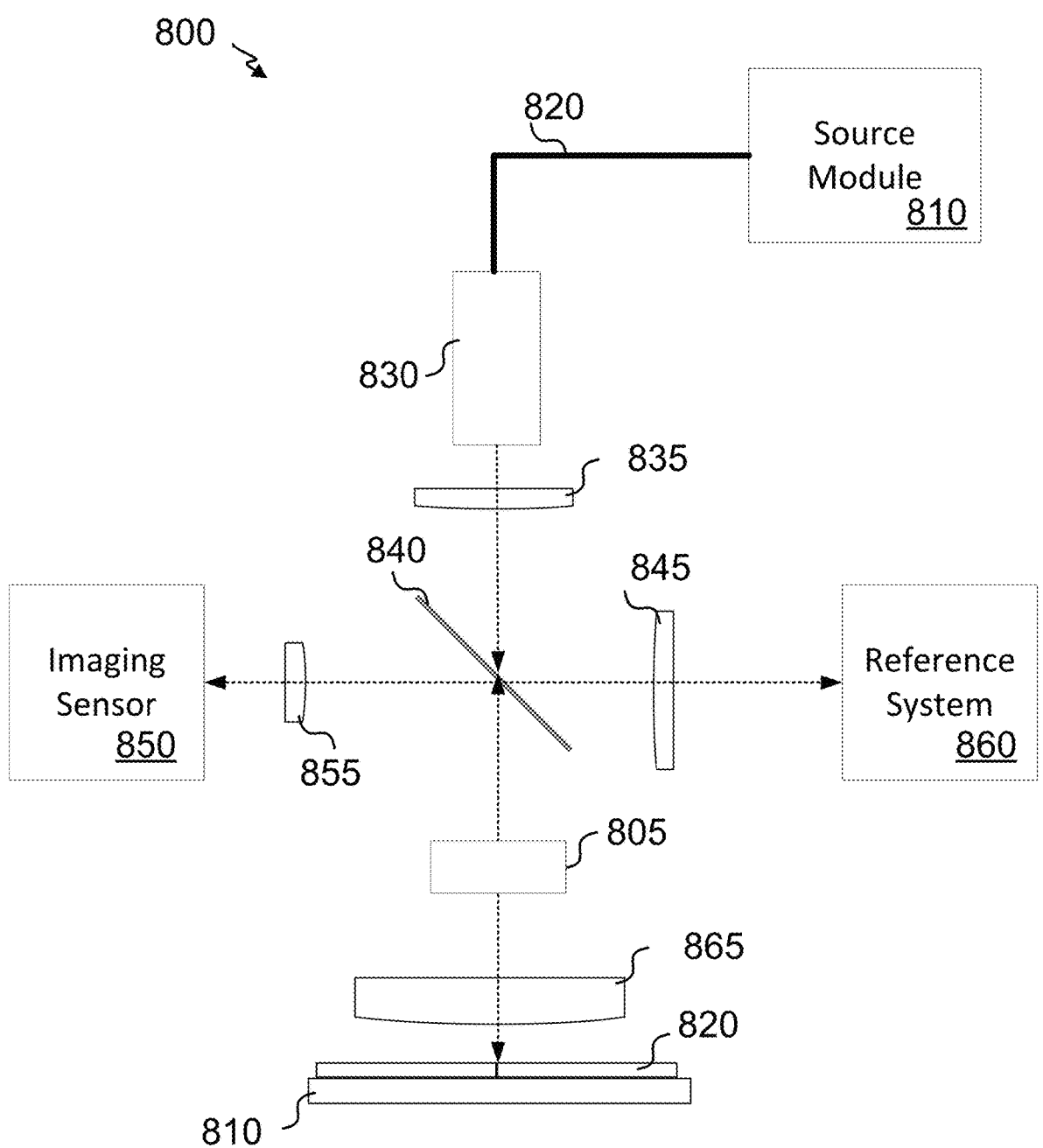
FIG. 10 is a simplified diagram of an exemplary metrology tool that may be configured to analyze a sample in accordance with embodiments described herein.

FIG. 10 is a simplified diagram of an exemplary metrology tool 800 that may be configured to analyze a sample 820 in accordance with embodiments described herein. As explained with regard to FIG. 9, the metrology tool 800 may be integrated with a processing chamber. In some examples, the metrology tool 800 is an imaging reflectometer. In this example, electromagnetic radiation (referred to herein as light) from a source module 810 is relayed through a light guide 820 to a homogenizer 808. The light from the homogenizer 808 is directed toward a beam splitter 840. A portion of the light is reflected by the beam splitter 840 toward a reference system 860 and a portion of the light passes through the beam splitter 840) and continues along an optical path toward the sample 820.

In this example, the portion of the light that passes through the beam splitter 840 passes through a polarizer 805 and is imaged by a lens 865 onto the sample 820. The lens 865 can be composed of a single lens or include a plurality of lenses. Light reflected from the sample 820 is directed through at least a portion of the lens 865 and reflected by the beam splitter 840 toward one or more imaging sensors (e.g., detectors) 850. The plurality of metrology targets on the sample 820 can provide spectroscopic emissions when illuminated by the light. The one or more detectors 850 can be configured to simultaneously measure the spectroscopic emissions from at least some of the un-patterned and patterned metrology targets.

In some examples, a computing device that includes one or more processors can associate portions of the spectroscopic emissions with corresponding ones of the un-patterned and patterned metrology targets. The computing device may be part of the semiconductor processing tool, part of the metrology tool 800, or part of a separate computing system. The computing device can determine the one or more parameters associated with the plurality of patterned metrology targets based on at least one of the portions of the spectroscopic emissions associated with un-patterned metrology targets. As an example, the one or more parameters may include thickness of one or more layers of a multi-layer film stack or CD's of structures associated with the patterned metrology targets. In some embodiments, the computing device can derive at least one result regarding the fabrication process based on one or more parameters associated with the patterned metrology targets. For example, the at least one result can include a change in width, depth, sidewall angle, or pitch associated with features on the patterned metrology targets. In some examples, the computing device can adjust at least one parameter of the fabrication process based at least in part on the at least one result.

In some examples, the computing device can train a machine-learning model to estimate a critical dimension result in a future fabrication process using the one or more parameters. The one or more processors can adjust at least one process parameter of the fabrication process based at least in part on the one or more parameters. The at least one process parameter of the fabrication process can include pressure, flow, or a radio frequency of an electromagnetic field used during the fabrication process.

The metrology tool 800 may include a number of other lenses (e.g., 835, 845, 855) that shape and/or direct the light along optical paths to the sample 820, to the reference system 860, and direct the light reflected from the sample 820 to form images on the imaging sensor 850. It should be appreciated that metrology tools used in accordance with the embodiments described herein may not include all optical elements shown in FIG. 10 and/or may include other optical elements that are not included in this example. Further, the metrology tool 800 is used merely as an example and other types and/or configurations of metrology tools may be used with the embodiments described herein.

Figure 11:
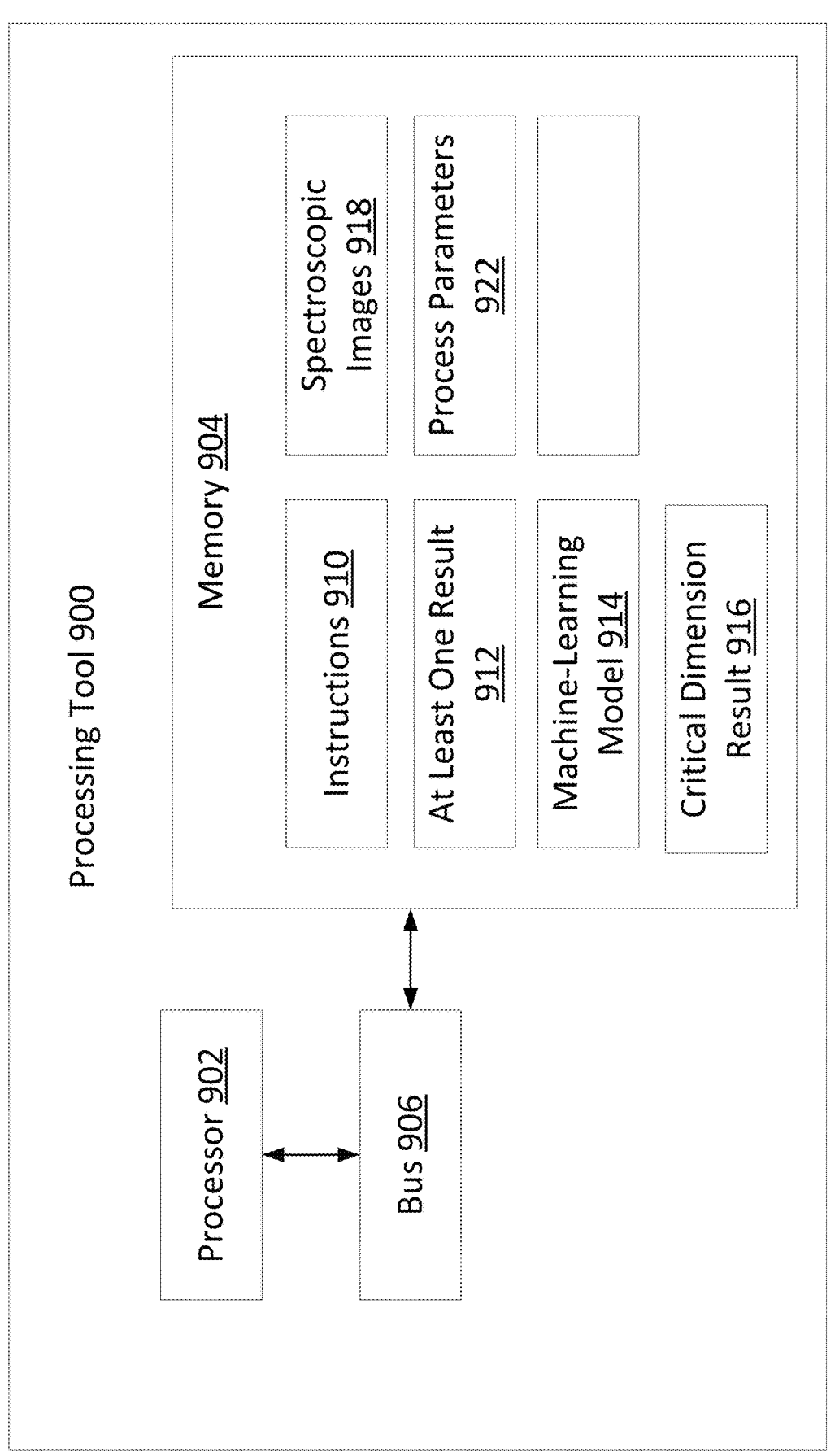
FIG. 11 is a block diagram of an exemplary processing tool for deriving at least one result regarding a fabrication process according to an embodiment.

FIG. 11 is a block diagram of an exemplary processing tool 900 for deriving at least one result 912 regarding a fabrication process according to one example of the present disclosure. The components shown in FIG. 11, such as a processor 902, a memory 904, a bus 906, and the like, may be integrated into a single structure such as within the single housing of the processing tool 900. Alternatively, the components shown in FIG. 11 can be distributed between processing tool 900, a metrology tool, and/or a computing device.

As shown, the processing tool 900 includes the processor 902 communicatively coupled to the memory 904 by the bus 906. The processor 902 can include one processor or multiple processors. Non-limiting examples of the processor 902 include a Field-Programmable Gate Array (FPGA), an application specific integrated circuit (ASIC), a microprocessor, or any combination of these. The processor 902 can execute instructions 910 stored in the memory 904 to perform operations described herein. In some examples, the instructions 910 can include processor-specific instructions generated by a compiler or an interpreter from code written in any suitable computer-programming language, such as C, C++, C#, or Java.

The memory 904 can include one memory device or multiple memory devices. The memory 904 can be non-volatile and may include any type of memory device that retains stored information when powered off. Non-limiting examples of the memory 904 include electrically erasable and programmable read-only memory (EEPROM), flash memory, or any other type of non-volatile memory. At least some of the memory 904 can include a non-transitory computer-readable medium from which the processor 902 can read instructions 910. The non-transitory computer-readable medium can include electronic, optical, magnetic, or other storage devices capable of providing the processor 902 with the instructions 910 or other program code. Non-limiting examples of the non-transitory computer-readable medium include magnetic disk(s), memory chip(s), RAM, an ASIC, or any other medium from which a computer processor can read instructions 910.

The memory 904 can further include spectroscopic images 918, process parameters 922, a machine-learning model 914, a critical dimension result 916, and at least one result 912 regarding the fabrication process. In some examples, the processing tool 900 can receive the spectroscopic images 918 from a detector and the processor 902 can associate portions of the spectroscopic images 918 with corresponding ones of a plurality of targets. The processor 902 can derive the at least one result 912 regarding the fabrication process based on at least one of the portions of the spectroscopic images 918. The processor 902 can adjust at least one of the process parameters 922 based at least in part on the at least one result 912. The process parameters 922 can include pressure, flow, or a radio frequency of an electromagnetic field used during the fabrication process.

In some examples, the processing tool 900 can implement the processes of FIG. 4, FIG. 7, and FIG. 8 for effectuating aspects of the present disclosure. It should be appreciated that the processing tool 900 is used merely as an example, and other types and/or configurations of processing tools may be used with the embodiments described herein.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art based on the embodiments provided herein without departing from the scope of the disclosure.

The methods, systems, and devices discussed above are examples. Various configurations may omit, substitute, or add various procedures or components as appropriate. For instance, in alternative configurations, the methods may be performed in an order different from that described, and/or various stages may be added, omitted, and/or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may be configured to perform the described tasks.

What is claimed is:

1. A system comprising:
   a semiconductor processing tool;
   a sample arranged within a chamber of the semiconductor processing tool, the sample having a plurality of un-patterned metrology targets and a plurality of patterned metrology targets, the plurality of un-patterned metrology targets and the plurality of patterned metrology targets both having or sharing a same multi-layer film stack, the semiconductor processing tool configured to perform a fabrication process on the sample; and a metrology tool integrated with the semiconductor processing tool, wherein at least one of the plurality of un-patterned metrology targets and at least one of the plurality of patterned metrology targets are within a single field of view of the metrology tool or with a single line scan of the metrology tool, wherein the metrology tool is configured to provide analysis of at least some of the plurality of un-patterned metrology targets and at least some of the plurality of patterned metrology targets during the fabrication process, and wherein optical metrology signals from the plurality of un-patterned metrology targets are used to determine one or more parameters associated with the plurality of patterned metrology targets.

2. The system of claim 1, wherein the metrology tool is configured to provide in situ analysis of at least some of the plurality of un-patterned metrology targets and at least some of the plurality of patterned metrology targets simultaneously during the fabrication process.

3. The system of claim 1, wherein the metrology tool comprises:

a source configured to provide a beam of electromagnetic radiation;

an optical system configured to direct the beam of electromagnetic radiation from the source to the sample, wherein the plurality of un-patterned metrology targets and the plurality of patterned metrology targets on the sample provide spectroscopic emissions when illuminated with the beam of electromagnetic radiation from the source;

a detector configured to measure the spectroscopic emissions from the plurality of un-patterned metrology targets and the plurality of patterned metrology targets;

one or more processors; and a memory that includes instructions executable by the one or more processors for causing the one or more processors to:

associate portions of the spectroscopic emissions with corresponding ones of the plurality of un-patterned metrology targets and the plurality of patterned metrology targets; and determine the one or more parameters associated with the plurality of patterned metrology targets.

4. The system of claim 1, further comprising one or more processors and a memory that includes instructions executable by the one or more processors for causing the one or more processors to derive at least one result regarding the fabrication process based on the one or more parameters associated with the plurality of patterned metrology targets, wherein the at least one result comprises a change in width, depth, or sidewall angle associated with features on the plurality of patterned metrology targets.

5. The system of claim 4, further comprising instructions executable by the one or more processors for causing the one or more processors to adjust at least one process parameter of the fabrication process based at least in part on the at least one result.

6. The system of claim 1, wherein determining the one or more parameters associated with the plurality of patterned metrology targets includes determining thicknesses of one or more layers of the multi-layer film stack on at least one of the plurality of un-patterned metrology targets, and using the thicknesses of the one or more layers to determine the one or more parameters associated with the plurality of patterned metrology targets.

7. The system of claim 1, wherein determining the one or more parameters associated with the plurality of patterned metrology targets includes simultaneously or iteratively fitting a film thickness model associated with the multi-layer film stack on the plurality of un-patterned metrology targets, and fitting a critical dimension model associated with the one or more parameters.

8. The system of claim 1, wherein the metrology tool is configured to perform multi-spectral imaging techniques or multi-channel imaging techniques.

9. The system of claim 1, wherein the plurality of patterned metrology targets include structures forming lines and spaces therebetween.

10. The system of claim 9, wherein the metrology tool comprises:

an imaging device configured to simultaneously obtain spectroscopic images of at least some of the plurality of un-patterned metrology targets and at least some of the plurality of patterned metrology targets during the fabrication process;

one or more processors; and a memory that includes instructions executable by the one or more processors for causing the one or more processors to:

associate portions of the spectroscopic images with corresponding ones of the plurality of un-patterned metrology targets and the plurality of patterned metrology targets; and determine the one or more parameters associated with the plurality of patterned metrology targets.

11. The system of claim 9, wherein the one or more parameters comprises a width, depth, sidewall angle, or pitch associated with at least one of the lines and/or the spaces.

12. The system of claim 9, further comprising one or more processors and a memory that includes instructions executable by the one or more processors for causing the one or more processors to train a machine-learning model to identify a critical dimension of the structures in a future fabrication process using the one or more parameters.

13. The system of claim 10, further comprising instructions executable by the one or more processors for causing the one or more processors to adjust at least one process parameter of the fabrication process based at least in part on the one or more parameters.

14. The system of claim 13, wherein the at least one process parameter comprises pressure, flow, or a radio frequency of an electromagnetic field used during the fabrication process.

15. The system of claim 13, wherein the plurality of un-patterned metrology targets are designed to assist in analysis of the plurality of patterned metrology targets.

16. A method comprising:

arranging a sample within a chamber of a semiconductor processing tool, the sample having a plurality of un-patterned metrology targets and a plurality of patterned metrology targets, the plurality of un-patterned metrology targets and the plurality of patterned metrology targets both having a same multi-layer film stack;

performing a fabrication process on the sample;

providing, by a metrology tool integrated with the semiconductor processing tool, analysis of at least some of the plurality of un-patterned metrology targets and at least some of the plurality of patterned metrology targets during the fabrication process, wherein at least one of the plurality of un-patterned metrology targets and at least one of the plurality of patterned metrology targets are within a single field of view of the metrology tool or with a single line scan of the metrology tool; and determining one or more parameters associated with the plurality of patterned metrology targets using optical metrology signals from the plurality of un-patterned metrology targets.

17. The method of claim 16, wherein providing the analysis of at least some of the plurality of un-patterned metrology targets and at least some of the plurality of patterned metrology targets includes:

illuminating the sample with a beam of electromagnetic radiation from a source of the metrology tool;

measuring spectroscopic emissions from at least some of the plurality of un-patterned metrology targets and at least some of the plurality of patterned metrology targets;

associating portions of the spectroscopic emissions with corresponding ones of the plurality of un-patterned metrology targets and the plurality of patterned metrology targets; and determining the one or more parameters based on at least one of the portions of the spectroscopic emissions.

18. The method of claim 16, wherein determining the one or more parameters associated with the plurality of patterned metrology targets includes determining thicknesses of one or more layers of the multi-layer film stack on at least one of the plurality of un-patterned metrology targets, and using the thicknesses of the one or more layers to determine the one or more parameters associated with the plurality of patterned metrology targets.

19. The method of claim 16, wherein determining the one or more parameters associated with the plurality of patterned metrology targets includes simultaneously or iteratively fitting a film thickness model associated with the multi-layer film stack on the plurality of un-patterned metrology targets, and fitting a critical dimension model associated with the one or more parameters.

\* \* \* \* \*